(12) United States Patent
Tun et al.

(10) Patent No.: US 9,583,573 B2
(45) Date of Patent: *Feb. 28, 2017

(54) COMPOUND SEMICONDUCTOR DEVICE AND METHOD OF FABRICATING THE SAME

(71) Applicant: FORMOSA EPITAXY INCORPORATION, Taoyuan County (TW)

(72) Inventors: Chun-Ju Tun, Taoyuan County (TW); Yi-Chao Lin, Taoyuan County (TW); Chen-Fu Chiang, Taoyuan County (TW); Cheng-Huang Kuo, Tainan (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/529,453

(22) Filed: Oct. 31, 2014

(65) Prior Publication Data

US 2015/0053997 A1 Feb. 26, 2015

Related U.S. Application Data

(62) Division of application No. 13/975,523, filed on Aug. 26, 2013, now Pat. No. 9,142,621.

(51) Int. Cl.
*H01L 29/20* (2006.01)
*H01L 29/36* (2006.01)
(Continued)

(52) U.S. Cl.
CPC ...... *H01L 29/2003* (2013.01); *H01L 21/0242* (2013.01); *H01L 21/0254* (2013.01); *H01L 21/02439* (2013.01); *H01L 21/02458* (2013.01); *H01L 21/02639* (2013.01); *H01L 21/2258* (2013.01); *H01L 21/266* (2013.01); *H01L 21/26546* (2013.01); *H01L 29/201* (2013.01); *H01L 29/205* (2013.01);
(Continued)

(58) Field of Classification Search
CPC ........ H01L 21/02639; H01L 21/02647; H01L 21/0242; H01L 21/02603; H01L 21/02609; H01L 21/02612; H01L 21/02636
See application file for complete search history.

(56) References Cited

U.S. PATENT DOCUMENTS 5,093,696 A * 3/1992 Kinoshita ............. G02B 6/131
117/94
5,373,521 A * 12/1994 Takahashi ............. B82Y 20/00
372/45.01

(Continued)

*Primary Examiner* — Jaehwan Oh
(74) *Attorney, Agent, or Firm* — Patterson + Sheridan, LLP (57) ABSTRACT

A compound semiconductor device is disclosed. The compound semiconductor device comprises a substrate having at least a first doped region and at least a second doped region; a semiconductor layer disposed on the substrate; and a buffer layer located between said substrate and said semiconductor layer; wherein doping conditions of said first doped region and said second doped region are different from each other; wherein said semiconductor layer has different thicknesses on locations corresponding to said first doped region and said second doped region respectively, and is formed as a structure with difference in thickness.

29 Claims, 9 Drawing Sheets

(51) Int. Cl.
*H01L 21/266* (2006.01)
*H01L 21/02* (2006.01)
*H01L 31/0352* (2006.01)
*H01L 31/18* (2006.01)
*H01L 21/225* (2006.01)
*H01L 21/265* (2006.01)
*H01L 29/201* (2006.01)
*H01L 29/205* (2006.01)
*H01L 29/207* (2006.01)
*H01L 33/24* (2010.01)

(52) U.S. Cl.
CPC ............ *H01L 29/207* (2013.01); *H01L 29/36* (2013.01); *H01L 31/0352* (2013.01); *H01L 31/1852* (2013.01); *H01L 31/1856* (2013.01); *H01L 33/24* (2013.01); *Y02E 10/544* (2013.01); *Y02P 70/521* (2015.11)

(56) References Cited

U.S. PATENT DOCUMENTS

| | | | | |
|---|---|---|---|---|
| 5,488,233 A * | 1/1996 | Ishikawa | ................ | B82Y 20/00 257/201 |
| 5,546,418 A * | 8/1996 | Ishibashi | ................ | B82Y 20/00 372/46.01 |
| 5,827,754 A * | 10/1998 | Min | ................ | B82Y 20/00 438/40 |
| 6,242,764 B1 * | 6/2001 | Ohba | ................ | H01L 33/32 257/190 |
| 6,265,289 B1 * | 7/2001 | Zheleva | ............ | H01L 21/02378 257/190 |
| 6,316,785 B1 * | 11/2001 | Nunoue | ................ | B82Y 20/00 257/103 |
| 7,521,274 B2 * | 4/2009 | Hersee | ................ | B82Y 20/00 438/41 |
| 7,935,615 B2 * | 5/2011 | Shibata | ................ | C30B 25/18 257/11 |
| 8,173,462 B2 * | 5/2012 | Kuo | ................ | H01L 21/0237 257/E21.221 |
| 8,350,249 B1 * | 1/2013 | Svensson | ............ | H01L 29/0676 257/13 |
| 8,652,947 B2 * | 2/2014 | Wang | ................ | H01L 21/02609 257/E21.431 |
| 8,759,814 B2 * | 6/2014 | Yang | ................ | H01L 33/18 257/103 |
| 8,828,849 B2 * | 9/2014 | Wang | ................ | C30B 25/00 257/76 |
| 2002/0043208 A1 * | 4/2002 | Biwa | ................ | C30B 25/02 117/94 |
| 2004/0203229 A1 * | 10/2004 | Fang | ................ | H01L 29/665 438/649 |
| 2006/0112466 A1 * | 5/2006 | Den | ................ | B82Y 10/00 257/1 |
| 2006/0144812 A1 * | 7/2006 | Imada | ................ | B29C 59/022 216/22 |
| 2006/0151797 A1 * | 7/2006 | Park | ................ | C30B 25/183 257/86 |
| 2008/0036038 A1 * | 2/2008 | Hersee | ................ | B82Y 20/00 257/615 |
| 2012/0295417 A1 * | 11/2012 | Adam | ................ | H01L 29/165 438/478 |

\* cited by examiner

COMPOUND SEMICONDUCTOR DEVICE AND METHOD OF FABRICATING THE SAME

REFERENCE TO RELATED APPLICATION

This Application is being filed as a Divisional Application of Ser. No. 13/975,523, filed 26 Aug. 2013, currently pending.

FIELD OF THE INVENTION

The present invention relates generally to a compound semiconductor device and a method of fabricating the same, and particularly to a compound semiconductor device comprising a substrate having different doping conditions and a method of fabricating the same.

BACKGROUND OF THE INVENTION

According to the current technology, the material generally used as a substrate for forming gallium-nitride based light-emitting diodes (LEDs) is sapphire ($Al_2O_3$) or silicon carbide (SiC). When a GaN semiconductor layer is grown on the substrate, lattice defects or dislocations may occur in the semiconductor layer because the lattice constant or the crystal structure of the substrate are different from the semiconductor layer. The defects may extend from the bottom of the semiconductor layer to the surface of the LED, damage the light-emitting layer of the LED and reduce the light-emitting efficiency of the LED.

Figure 1A:
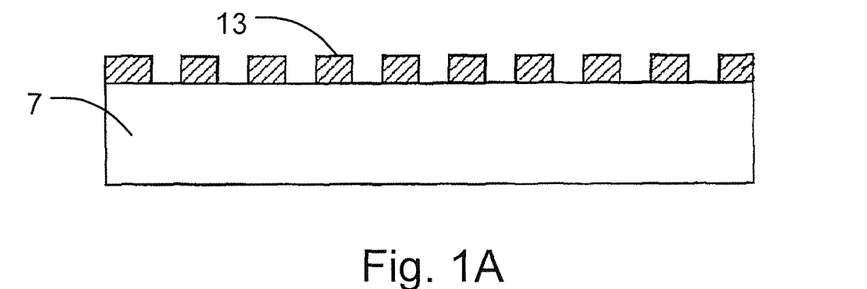
FIG. 1A~1C show process diagrams for preparing nano-rods according to the prior art.
Figure 1B:
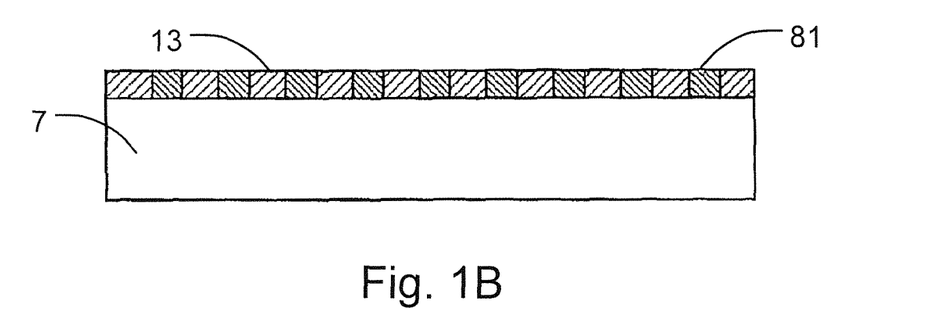
Figure 1C:
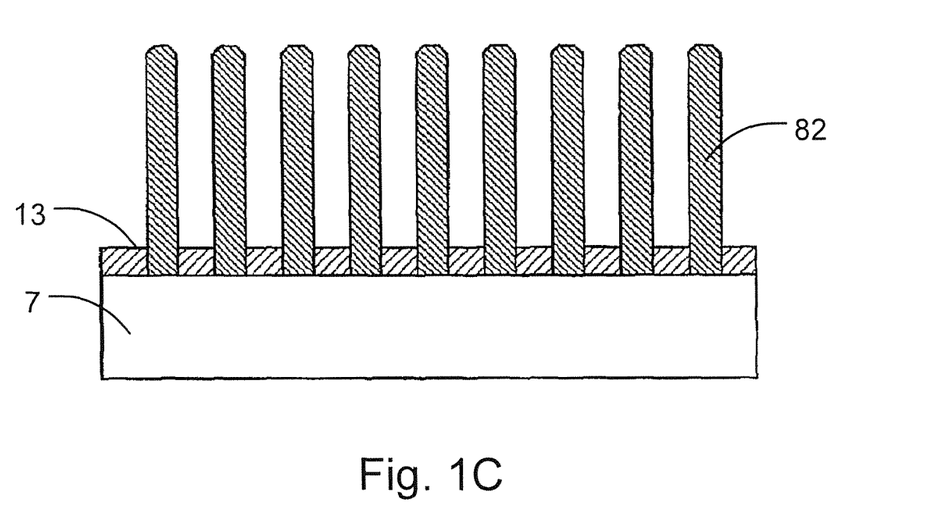

So that, one of prior methods for improving the light-emitting efficiency of the LED is to reduce or decrease quantity or density of the defects. According to the current technology, as disclosed by U.S. Pat. No. 7,521,274 ('274 patent), one kind of approaches to reduce the defects is forming a GaN rod structure in nanometer scale on a substrate before forming a GaN semiconductor layer thereon. As shown in FIGS. 1A to 1C, a patterned mask 13 which having a plurality of holes in nanometer scale for exposing a partial surface of a substrate 7 is disposed on the substrate 7. Then a semiconductor material 81 is directly grown in the holes by using non-pulse method, and forming a plane with the mask 13. After that, the semiconductor rods 82 are subsequently grown on the semiconductor material 81 by using pulse method.

There is another kind of approaches to grow GaN nano-rods on a silicon substrate as disclosed by U.S. pat. No. 7,981,714 ('714 patent). As disclosed in the '714 patent, the first step is to perpendicularly grow a plurality of nano-rods on a silicon substrate directly. The second step is to fill the gaps among nano-rods with an amorphous material while expose upper portions of the nano-rods, which is quite difficult. Finally, the third step is to use part of the upper portions of the nano-rods as seeds of crystallization to grow GaN on the amorphous material.

SUMMARY

Nonetheless, according to the prior methods disclosed above, it is extremely difficult to grow semiconductor material in the holes in nanometer scale. In addition, it is not easy to control uniformity of nano-rods by using the pulse method wafer-to-wafer, and variations among fabricating results of products are significant accordingly. Further, the maintenance cycle of the machine for growing the nano-rods is shorter, which means the cost of the mass production will increase. Furthermore, the process for these kinds of secondary growth method is complex and resulting in lower yield.

Therefore, one of embodiments according to the present invention is to provide a compound semiconductor device comprising a substrate having at least a first doped region and at least a second doped region; and a semiconductor layer disposed on the substrate; wherein doping conditions of the first doped region and the second doped region may be different from each other.

Another one of embodiments according to the present invention is to provide a method of fabricating the compound semiconductor device. The steps of the method comprise forming at least a mask on a substrate; doping the substrate to form at least a first doped region and at least a second doped region; and forming a semiconductor layer on the substrate.

Another one of embodiments according to the present invention is to provide a compound semiconductor device comprising a buffer layer having at least a first doped region and at least a second doped region; and a semiconductor layer disposed on the buffer layer; wherein doping conditions of the first doped region and the second doped region may be different from each other; wherein said semiconductor layer has different thicknesses on locations corresponding to said first doped region and said second doped region respectively, and is formed as a structure with difference in thickness.

Another one of embodiments according to the present invention is to provide a compound semiconductor device comprising a substrate having at least a first doped region; and a semiconductor layer disposed on the substrate; wherein the growth rate of the semiconductor layer on said first doped region may be faster than that on other regions of the substrate.

Another one of embodiments according to the present invention is to provide a compound semiconductor device comprising a substrate; and a buffer layer disposed on the substrate and having at least a first doped region; wherein the surface of said first doped region may be uneven; and a semiconductor layer, disposed on said buffer layer; wherein said semiconductor layer has different thicknesses on locations corresponding to said first doped region and is formed as a structure with difference in thickness.

Another one of embodiments according to the present invention is to provide a compound semiconductor device comprising a substrate having at least a first doped region and at least a second doped region; a semiconductor layer disposed on said substrate; and a buffer layer located between said substrate and said semiconductor layer; wherein doping conditions of said first doped region and said second doped region are different from each other; wherein said semiconductor layer has different thicknesses on locations corresponding to said first doped region and said second doped region respectively, and is formed as a structure with difference in thickness.

DETAILED DESCRIPTION

In order to make the structure and characteristics as well as the effectiveness of the present invention to be further understood and recognized, the detailed description of the present invention is provided as follows along with embodiments and accompanying figures.

Figure 2A:
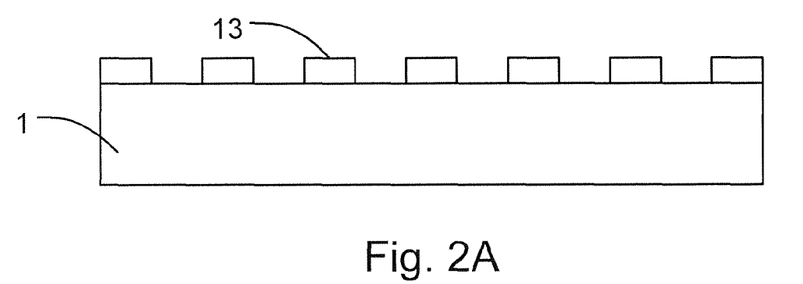
FIG. 2A~2D show a process procedure and schematic diagrams of structural changes for the doping process and the growth of semiconductor layers according to a preferred embodiment of the present invention.
Figure 2B:
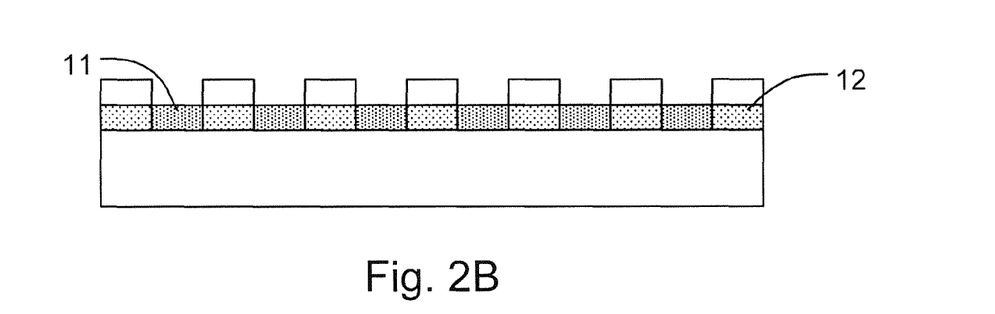

First, please refer to FIGS. 2A to 2D, which show cross-sectional structural changes in each step during the fabricating process for the semiconductor structure with difference in thickness according to the present invention. The steps comprise:

Step S1: As shown in FIG. 2A and FIG. 2B, dope a substrate to form at least a first doped region and at least a second doped region. The first doped region and the second doped region may have different doping conditions. For example, they can have different dopants, doping depths, or doping concentrations. The material of the substrate may be sapphire, silicon carbide, silicon, gallium arsenide, gallium oxide, gallium nitride, aluminum, lithium aluminate, lithium gallate, or aluminum nitride.

Figure 2C:
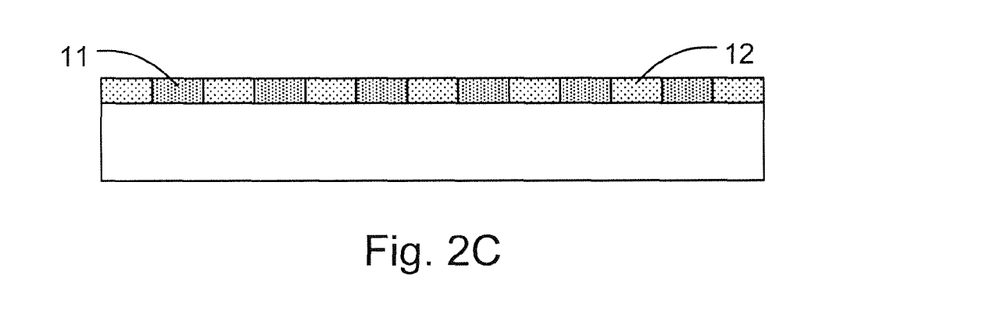
Figure 2D:
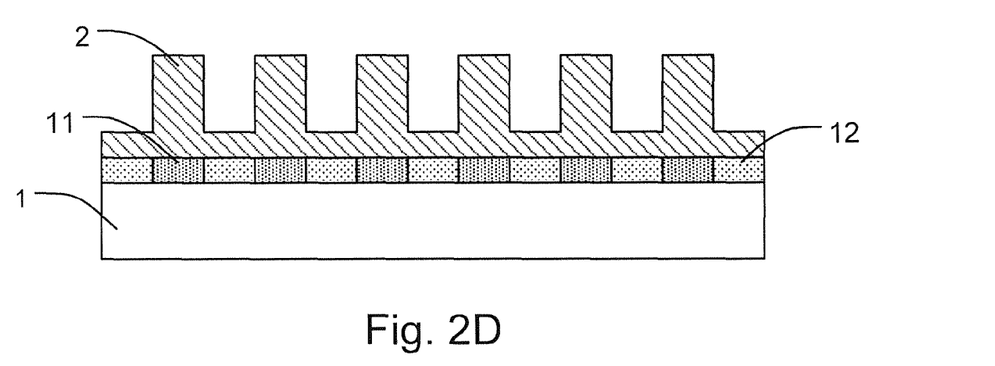

Step S2: As shown in FIG. 2C and FIG. 2D, grow a semiconductor layer on the substrate. The thicknesses of the semiconductor layer on the first and second doped regions are different, which means the semiconductor layer has at least a structure with difference in thickness.

According to the present invention, the doping method includes ion implantation or ion diffusion. For example, in the step S1, firstly, as shown in FIG. 2A, the mask 13 in the present embodiment is formed on the sapphire substrate 1. Then, ion implantation is used to produce at least a first doped region 11 and at least a second doped region 12, as shown in FIG. 2B. The first and second doped regions 11, 12 can be arranged periodically or irregularly. The first doped region 11 will be doped with more dopants than the second doped region 12 because the mask 13 does not cover the region 11 during the ion implantation process. According to the present invention, the dopants used in the step S1 may be selected from the group consisting of aluminum (Al), nitrogen (N), gallium (Ga), magnesium (Mg), zinc (Zn), indium (In), chrome (Cr), titanium (Ti), silicon (Si), and argon (Ar). Besides, the doping concentration of the first doped region H ranges from $1\times10^{14}$ to $1\times10^{21}$ (1/cm$^3$). Further, the doping concentration of the second doped region 12 may be not less than zero but smaller than the doping concentration of the first doped region 11. According to another embodiment of the present invention, the dopants for the first doped region 11 are different from those for the second doped region 12. Alternatively, this doping step can be performed on a buffer layer or any semiconductor layer other than the substrate 1 by using similar ion implantation or ion diffusion methods. The doping methods and the doping locations are not limited.

Next, in the step S2, as shown in FIGS. 2C and 2D, the mask 13 on the substrate 1 is removed after the step S1. Then a semiconductor layer 2 which may comprise III-V compound material, such as including $Al_{x1}Ga_{y1}In_{1-x1-y1})N$, $1 \geq x1 \geq 0$, $1 \geq y1 \geq 0$, is grown on the substrate 1. The lattice constant or the crystal structure of the semiconductor 2 is different from the lattice constant or the crystal structure of the undoped portion of the substrate 1. Because the first and second doped regions 11, 12 of the substrate 1 have different doping concentrations or different dopants, the growth rate of the semiconductor layer 2 on the first doped region 11 is different from the growth rate on the second doped region 12. Thereby, given a fixed growth time, there will be a difference in thicknesses of the semiconductor layer 2 on the first and second doped regions 11, 12. As shown in FIG. 2D, the growth rate of the semiconductor layer 2 on the first doped region 11 is faster than the growth rate on the second doped region 12. Thereby, the thickness of the semiconductor layer 2 grown on the first doped region 11 is greater than that on the second doped region 12, which means the semiconductor layer 2 has at least a structure with difference in thickness. The difference in thickness of the semiconductor layer 2 can be arranged periodically or irregularly.

Figure 2E:
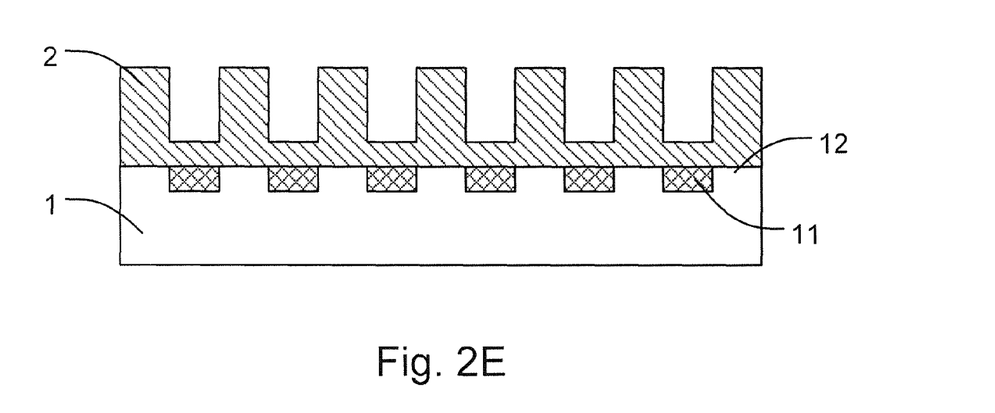
FIGS. 2E~2F show structural schematic diagram according to a preferred embodiment of the present invention.
Figure 2F:
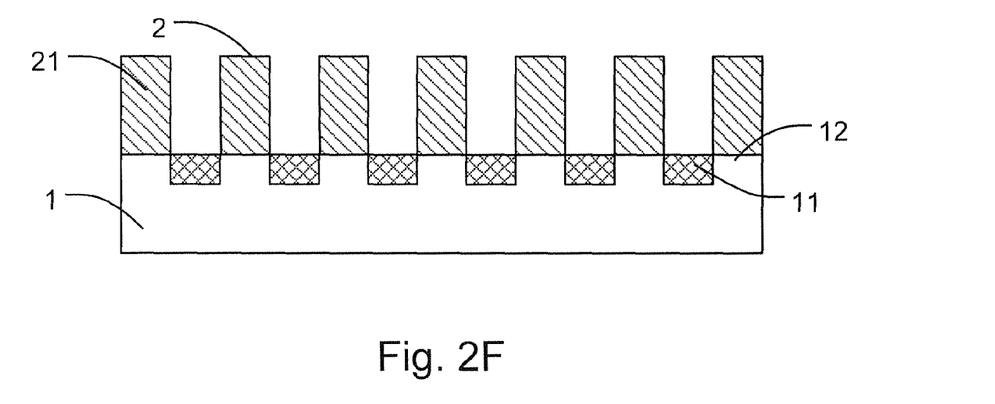

Compared with the previous embodiment, according to another embodiment of the present invention, on the contrary, the grown thickness of the semiconductor layer 2 on the first doped region 11 may be smaller than that on the second doped region 12, as shown in FIGS. 2E and 2F. According to this embodiment, ion implantation is used for implanting dopants that is adverse for growing semiconductor on the first doped region 11, or destroying the crystal structure in the first doped region 11 or altering the lattice constant of the region 11. Thereby, the growth rate of the semiconductor layer 2 on the first doped region 11 is reduced. For example, the growth condition in FIG. 2E shows that the growth rate of the semiconductor layer 2 on the first doped region 11 is lower than that on the second doped region 12. Furthermore, the growth condition in FIG. 2F shows that the growth rate of the semiconductor layer 2 on the first doped region 11 is zero. Accordingly, the grown thickness of the semiconductor layer 2 on the second doped region 12 is greater than that on the first doped region 11, and thus forming the structure with difference in thickness contrary to the structure shown in FIG. 2D. Moreover, according to another embodiment of the present invention, it uses ion implantation or ion diffusion method to dope a buffer layer or any other semiconductor layer to form a first doped region II. Because the crystal structure of the first doped region 11 is destroyed, a rough or uneven surface is formed on the surface of the first doped region 11. Thereby, the optical diffraction effect can be enhanced, and the light-emitting efficiency of the LEDs fabricated according to the present embodiment can be improved.

Figure 3:
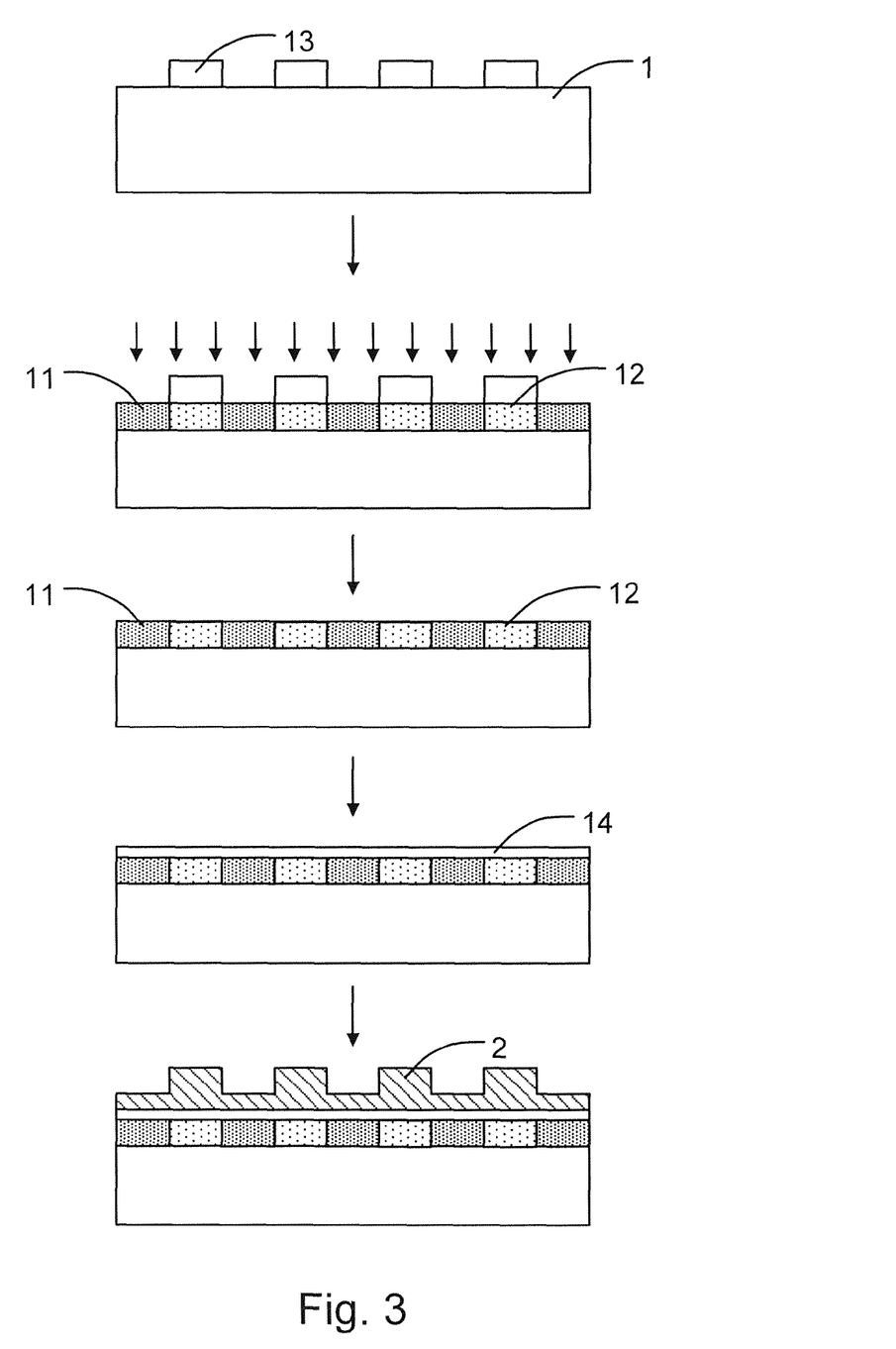
FIG. 3 shows a process procedure and schematic diagrams of structural changes according to a preferred embodiment of the present invention.

FIG. 3 shows another embodiment of the present invention. Compared to the embodiments described above, according to the present embodiment, a buffer layer 14 is formed on the substrate 1 after doping the substrate 1 and defining the first and second doped regions 11, 12. The material of the buffer layer 14 may comprise one selected form the group consisting of $Al_{x2}Ga_{y2}In_{1-x2-y2})N$, $1 \geq x2 \geq 0$, $1 \geq y2 \geq 0$, ZnO, MgO, and SiC. Though the buffer layer 14 covers the first and second doped regions 11, 12, the semiconductor layer 2 is still influenced by the difference between the first and second doped regions 11, 12 while growing the semiconductor layer 2 on the buffer layer 14. Therefore, a structure with difference in thickness is formed at the locations corresponding to the first and second doped regions 11, 12.

Figure 4:
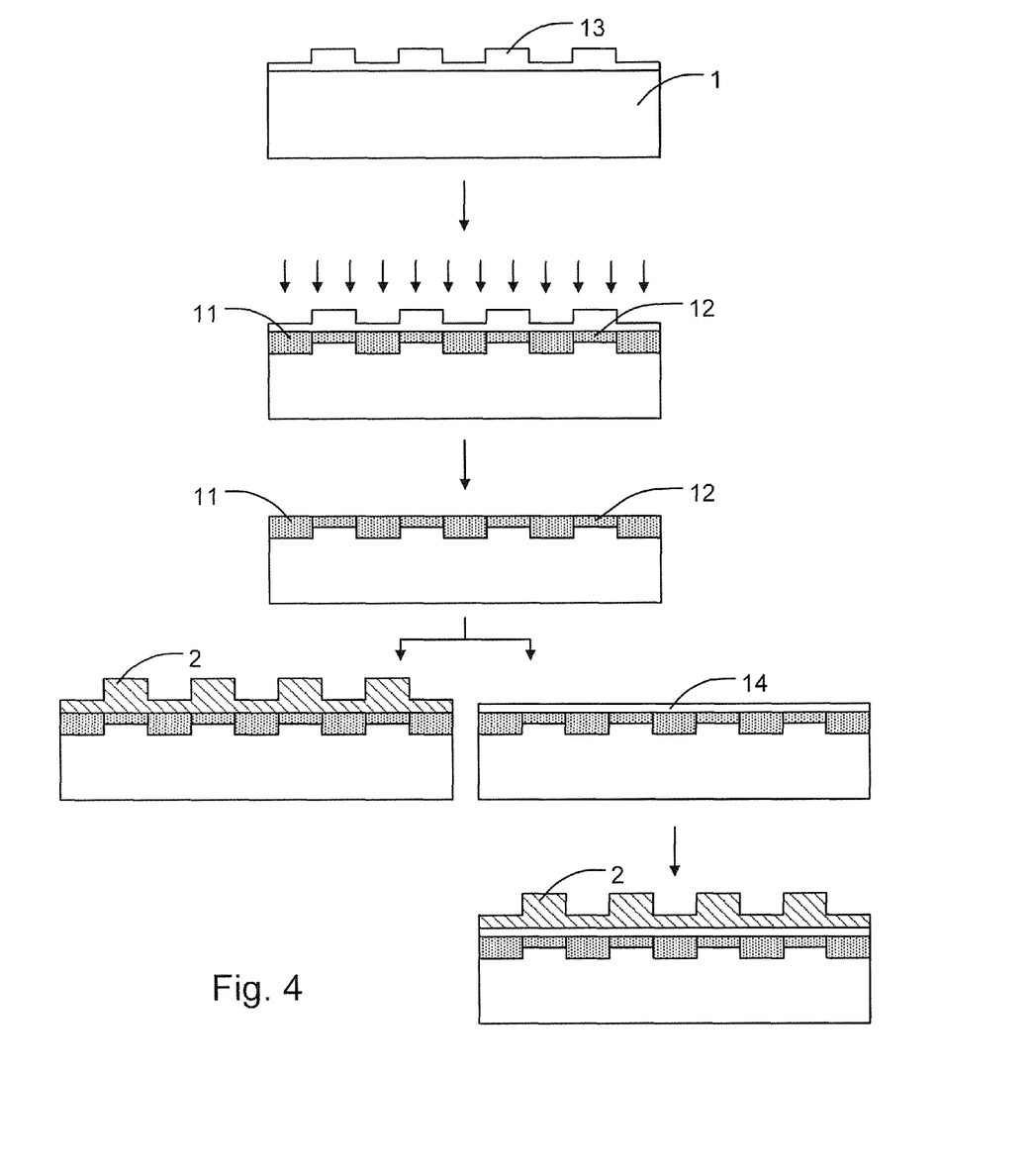
FIG. 4 shows another process procedure and schematic diagrams of structural changes according to a preferred embodiment of the present invention.

FIG. 4 shows another embodiment of the present invention. Compared to the embodiments described above, the major difference is that at least two regions of the mask 13 according to the present embodiment may have different thicknesses. When ion implantation or diffusion is used on the substrate 1 for doping, different doping condition will result according to the different regional thicknesses of the mask 13. Thereby, at least a first doped region 11 and a second doped region 12 are formed correspondingly, where the doping depth and concentration of the first doped regions 11 are different from those of the second doped region 12. As shown in FIG. 4, the first doped region 11 is formed on the region of the substrate 1 corresponding to the thinner region of mask 13, and the second doped region 12 is formed on the region of the substrate 1 corresponding to the thicker region of mask 13. Besides, the doping depth at the first doped region 11 may be deeper than that at the second doped region 12. Further, the doping concentration at the first doped region 11 may be higher than that at the second doped region 12. Thereby, when the semiconductor layer 2 is grown directly on the first and second doped regions 11, 12, or indirectly on the buffer layer 14 subsequently, the thickness of the semiconductor layer 2 on the first doped region 11 is thinner than that on the second doped region 12. It is because the growth rate of semiconductor corresponding to the first doped region 11 is slower than that corresponding to the second doped region. Then the semiconductor layer 2 grown in the form of the structure with difference in thickness according to the present invention is provided.

Figure 5:
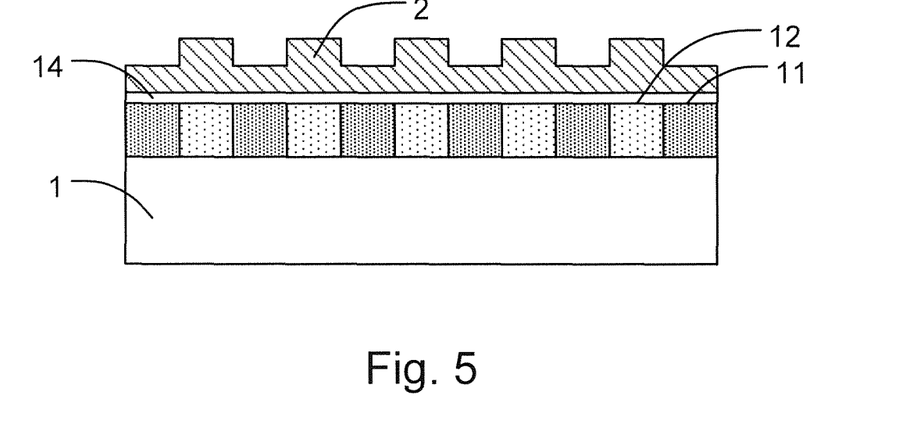
FIG. 5 shows a structural schematic diagram of different type or quantity of the doping ions according to a preferred embodiment of the present invention.

FIG. 5 shows another embodiment of the present invention. Compared to the embodiments described above, according to the present embodiment, further implantation step may perform on at least a portion of the doped regions 11 or 12 on the substrate 1, which is using multiple implantation method to make the number of implanted ion in the first doped region 11 different from that in the second doped region 12. Furthermore, different ions can be implanted in different implantation runs to make the first and second doped regions 11, 12 to have different implanted ions or doping conditions respectively. Thereby, the semiconductor layer 2 grown thereon can have the structure with difference in thickness.

Besides, the outline of the structure with difference in thickness of the semiconductor layer 2 according to the present invention can be line-shape, rod-shape, trench-shape, stair-shape, or any recess/protruding structure.

Figure 6:
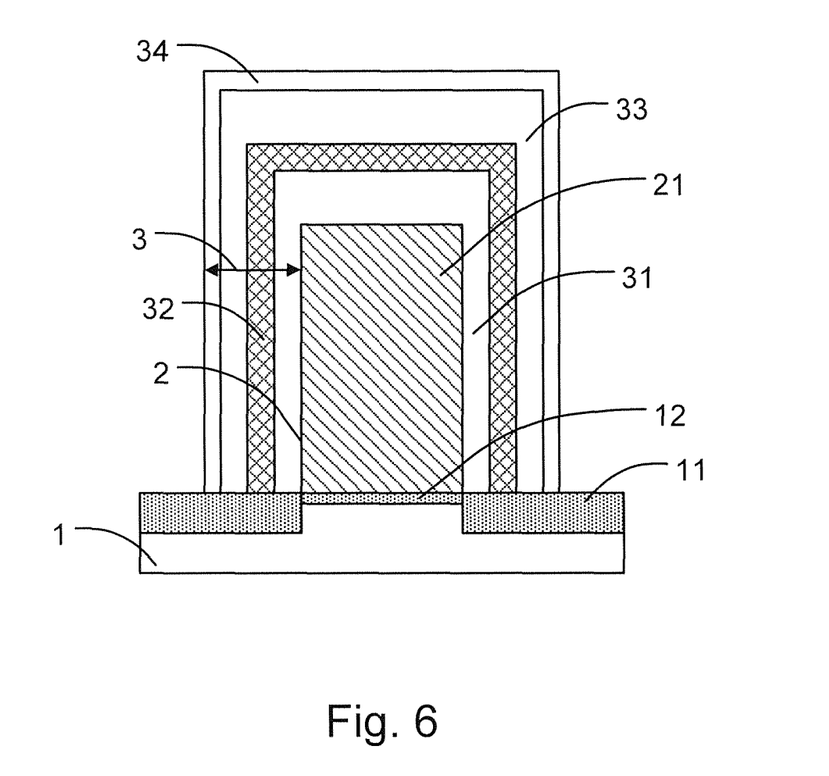
FIG. 6 shows a structural schematic diagram of an LED according to a preferred embodiment of the present invention.

By using the fabricating method described in above embodiments, a preferred embodiment according to the present invention can be formed as shown in FIG. 6. According to the present embodiment, after a rod structure 21 of the semiconductor layer 2 is formed on the second doped region 12, a functional layer or an epitaxial layer 3 may be formed surrounding the rod structure 21. This epitaxial layer 3 may comprise stack layers such as an N-type nitride layer 31, an active layer or a multiple quantum well (MQW) layer 32, a P-type nitride layer, and a transparent conductive layer 34. Then a compound semiconductor device according to the present invention having multiple function layers separately disposed on a substrate is provided.

According to the embodiment, the width of the second doped region 12 may range from 5 nm to 100 μm, and the width of the adjacent first doped region 11 may range from 100 nm to 100 μm. In other words, the semiconductor layer 2 forms a structure with thinner rods 21 in micrometer scale or nanometer scale, and wider spacing there between, such that the epitaxial layer 3 can have enough space to cover the rod structure 21.

Figure 7A:
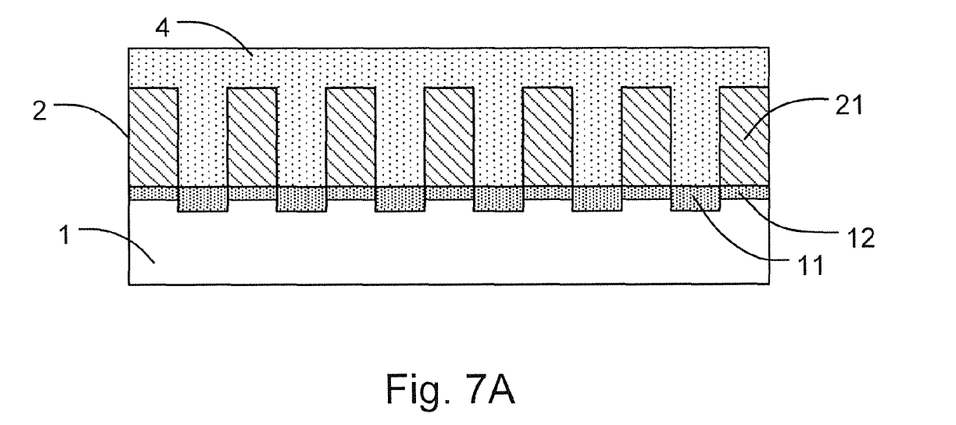
FIGS. 7A~7B show structural schematic diagrams according to another preferred embodiment of the present invention.
Figure 7B:
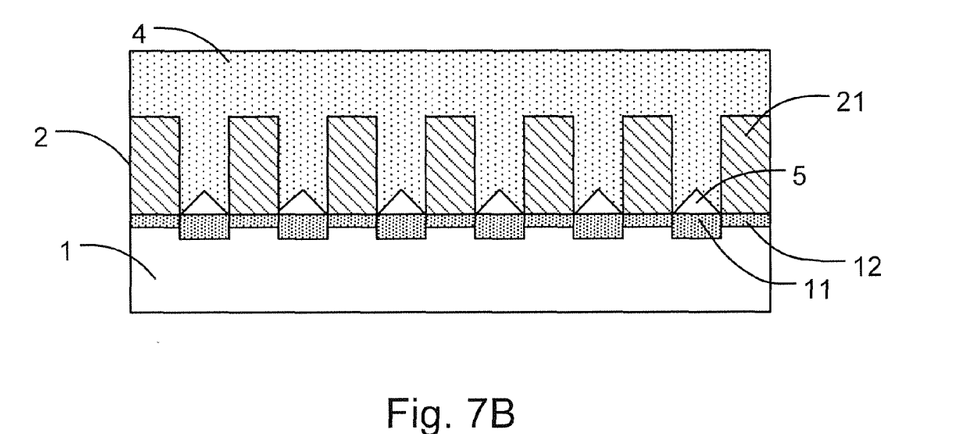

According to another preferred embodiment of the present invention, a compound semiconductor device may further comprise an extension layer 4 formed after forming the semiconductor layer 2 having the structure with difference in thickness. The extension layer 4 may comprise a III-V compound semiconductor, such as $Al_{x3}Ga_{y3}In_{1-x3-y3}N$, $1 \geq x3 \geq 0$, $1 \geq y3 \geq 0$, which can be identical to or different from the semiconductor layer 2. As shown in FIG. 7A, the extension layer 4 covers and fills the semiconductor layer 2 having the structure with difference in thickness. The extension 4 layer formed by growing and merging from upper portions of thicker parts of the semiconductor layer 2. The width of a first doped region 11 and a second doped region 12 of the substrate 1 according to the embodiment ranges from 5 nm to 50 μm. In addition, compared to the embodiment as shown in FIG. 7A described above, the extension layer 4 according to another preferred embodiment of the present invention as shown in FIG. 7B is not completely filled on the thinner region, a first doped region 11 for example. Thereby, at least a space 5 can be formed between the extension layer 4 and the substrate 1. The height of the space 5 may be not greater than 10 μm. Accordingly, the light scattering effect can be increased and the light-emitting efficiency of the LEDs fabricated according to the present embodiment can be enhanced.

Figure 8:
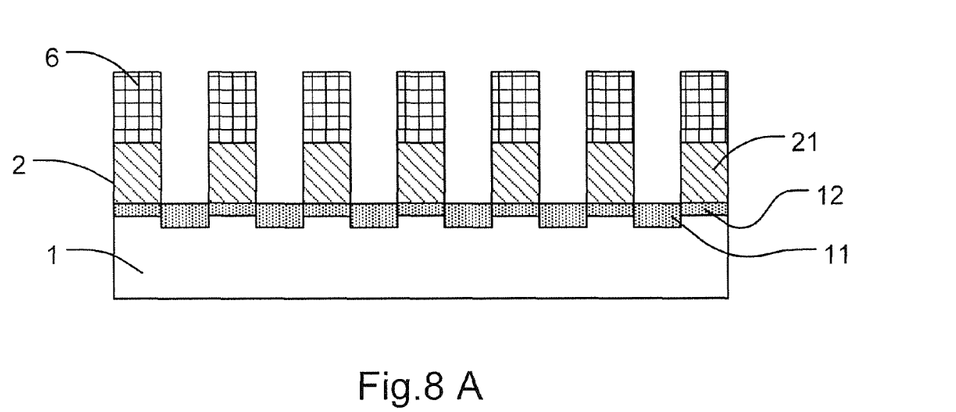
FIGS. 8A~8B show structural schematic diagrams according to still another preferred embodiment of the present invention.

As shown in FIG. 8A, according to another preferred embodiment, after the semiconductor layer 2 having the structure with difference in thickness is formed by one-time growth on the doped substrate, at least two extension members 6 are further formed on the thicker parts, such as the rod structure or protruding structure, of the semiconductor layer 2. The extension members 6 are seeds of crystallization for $Al_{x4}Ga_{y4}In_{1-x4-y4}N$, $1 \geq x4 \geq 0$, $1 \geq y4 \geq 0$ and can be identical to or different from the semiconductor layer 2. When growth process for semiconductor continues, at least some of semiconductor may grow laterally from the extension members 6 and merge to form an extension layer 4 covering the semiconductor layer 2, as shown in FIG. 8B. The extension layer 4 here may comprise $Al_{x4}Ga_{y4}In_{1-x4-y4}N$, $1 \geq x4 \geq 0$, $1 \geq y4 \geq 0$, and have at least a continuous surface which can be a plane or an undulate surface. Furthermore, the extension layer 4 can be a single or a multi-layer structure. According to the embodiment, the semiconductor layer 2 may have at least a space 5 between the extension layer 4 and the substrate 1. As the number of the spaces 5 is more than two, the length of the adjacent gaps between the spaces 5 may be the same or different.

After continuing growing functional layer or epitaxial layer structures on the extension layer 4, the compound semiconductor devices according to the present invention, such as LEDs, photodetectors, solar cells, or power transistors, can be provided. For example, an LED according to the present invention may further comprise the epitaxial structure of an N- or P-type semiconductor layer, an active layer, and a P- or N-type semiconductor layer formed sequentially on the extension layer 4. It has the advantages of high light-emitting efficiency, simplified process, high yield, and improved device lifetime. The method disclosed by the present invention is reliable and simple. In addition, the difficulty and drawbacks encountered by secondary growth can be reduced as well. Given the practical utility, the semiconductor device and the method of fabricating the same provided by the present invention would be extremely valuable.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A compound semiconductor device, comprising:
    a substrate having at least a first doped region and at least a second doped region;
    a semiconductor layer disposed on said substrate; and
    a buffer layer located between said substrate and said semiconductor layer; wherein doping conditions of said first doped region and said second doped region are different from each other; wherein said semiconductor layer has different thicknesses on locations corresponding to said first doped region and said second doped region respectively, and is formed as a structure with difference in thickness.

2. The compound semiconductor device of claim 1, wherein said first doped region or said second doped region comprises a dopant which is at least an element selected from the group consisting of aluminum (Al), nitrogen (N), gallium (Ga), magnesium (Mg), zinc (Zn), indium (In), chrome (Cr), titanium (Ti), silicon (Si), and argon (Ar).

3. The compound semiconductor device of claim 2, wherein said doping conditions comprise that the doping concentration of said first doped region is ranged from $1 \times 10^{14}$ to $1 \times 10^{21}$ ($1/cm^3$), and the doping concentration of said second doped region is not less than zero but smaller than the doping concentration of said first doped region.

4. The compound semiconductor device of claim 2, wherein said doping conditions comprise that the dopant of said first doped region is different from the dopant of said second doped region.

5. The compound semiconductor device of claim 1, wherein said doping conditions comprise that the doping depth of said first doped region is different from the doping depth of said second doped region.

6. The compound semiconductor device of claim 1, wherein the material of said semiconductor layer is a III-V compound.

7. The compound semiconductor device of claim 1, wherein the material of said semiconductor layer includes $Al_{x1}Ga_{y1}In_{(1-x1-y1)}N$, $1 \geq x1 \geq 0$, $1 \geq y1 \geq 0$.

8. The compound semiconductor device of claim 1, wherein said first doped region and said second doped region are arranged periodically or irregularly.

9. The compound semiconductor device of claim 1, wherein the growth rate of said semiconductor layer on said first doped region and the growth rate of said semiconductor layer on said second doped region are different from each other.

10. The compound semiconductor device of claim 1, wherein the outline of said structure with difference in thickness comprises at least one selected from line-shape, rod-shape, trench-shape, stair-shape, protruding structure, or recess structure.

11. The compound semiconductor device of claim 1, wherein the width of said first doped region or said second doped region is ranged from 5 nm to 50 μm.

12. The compound semiconductor device of claim 1, wherein the widths of said first doped region and said second doped region are different from each other.

13. The compound semiconductor device of claim 1, wherein the width of said first doped region is ranged from 100 nm to 100 μm, and the width of said second doped region is ranged from 5 nm to 100 μm.

14. The compound semiconductor device of claim 10, further comprising an epitaxial layer which includes an N-type nitride layer, an active layer and a P-type nitride layer, and is formed next to a rod-shaped structure of said semiconductor layer.

15. The compound semiconductor device of claim 1, further comprising an extension layer covering said semiconductor layer.

16. The compound semiconductor device of claim 15, wherein said extension layer fills said semiconductor layer.

17. The compound semiconductor device of claim 16, wherein a space is formed between said extension layer and said semiconductor layer.

18. The compound semiconductor device of claim 17, wherein the height of said space is not greater than 10 μm.

19. The compound semiconductor device of claim 16, wherein said extension layer is formed from upper portions of thicker parts of said semiconductor layer.

20. The compound semiconductor device of claim 16, wherein said semiconductor layer comprises at least two extension members located on the thicker parts of said semiconductor layer respectively, and said extension layer is formed from said extension member.

21. The compound semiconductor device of claim 18, wherein the number of said spaces is more than two, and the length of the adjacent gaps between said spaces are the same or different.

22. The compound semiconductor device of claim 16, further comprising an N-type semiconductor layer, an active layer and a P-type semiconductor layer formed on said extension layer.

23. The compound semiconductor device of claim 1, wherein the steps for fabricating said device comprising:
    forming at least a mask on said substrate;
    doping said substrate to form said first doped region and said second doped region; and
    forming said semiconductor layer on said substrate.

24. The compound semiconductor device of claim 23, wherein said doping step comprises implant ions in said substrate.

25. The compound semiconductor device of claim 23, wherein said doping step comprises diffuse ions in said substrate.

26. The compound semiconductor device of claim 23, wherein said mask has at least two regions with different thicknesses for forming said first doped region and said second doped region correspondingly on said substrate.

27. The compound semiconductor device of claim 23, wherein the dopant for doping said first doped region is different from the dopant for doping said second doped region in said doping step.

28. A compound semiconductor device, comprising:
    a buffer layer, having at least a first doped region and at least a second doped region; and
    a semiconductor layer, disposed on said buffer layer;
    wherein doping conditions of said first doped region and said second doped region are different from each other;

wherein said semiconductor layer has different thicknesses on locations corresponding to said first doped region and said second doped region respectively, and is formed as a structure with difference in thickness.

29. A compound semiconductor device, comprising:
   a substrate;
   a buffer layer, disposed on said substrate and having at least a first doped region and a second doped region; wherein the surface of said first doped region is uneven; and
   a semiconductor layer, disposed on said buffer layer; wherein said semiconductor layer has different thicknesses on locations corresponding to said first doped region said second doped region respectively, and is formed as a structure with difference in thickness.

* * * * *